United States Patent [19]
Tanigawa et al.

[11] Patent Number: 5,621,636
[45] Date of Patent: Apr. 15, 1997

[54] THIN DC-DC CONVERTER ARRANGEMENT

[75] Inventors: Kenichi Tanigawa; Hosei Hirano; Shingo Katayama; Nobuyoshi Tanaka; Sueyuki Yahagi, all of Kawasaki, Japan

[73] Assignee: Nippon Steel Corporation, Tokyo, Japan

[21] Appl. No.: 341,923

[22] Filed: Nov. 16, 1994

[30]     Foreign Application Priority Data

Feb. 22, 1994 [JP] Japan ................................ 6-024028
Mar. 18, 1994 [JP] Japan ................................ 6-049308
Apr. 19, 1994 [JP] Japan ................................ 6-080597

[51] Int. Cl.⁶ ........................................ G05F 3/16
[52] U.S. Cl. ................................................. 363/147
[58] Field of Search .............................. 363/140–147; 323/312–316; 330/264

[56]              References Cited

FOREIGN PATENT DOCUMENTS

| 6-66291 | 6/1989 | Japan . |
|---|---|---|
| 2-82008 | 6/1990 | Japan . |
| 6-53044 | 2/1994 | Japan . |
| 6-112035 | 6/1994 | Japan . |

*Primary Examiner*—Aditya Krishnan
*Attorney, Agent, or Firm*—Pollock, Vande Sande & Priddy

[57]                ABSTRACT

A thin DC-DC converter arrangement which includes an inductor including a thin ring-shaped coil having a hole in its center and a thin ferrite core for providing a closed magnetic path passing through the central hole of the coil and interlinking the ring-shaped coil, a thin circuit board formed on its one surface with an electric circuit of the DC-DC converter, and a radiator having at least one flat part, wherein the inductor, the circuit board and the radiator are integrally assembled.

16 Claims, 9 Drawing Sheets

FIG. 7A       FIG. 7B       FIG. 7C
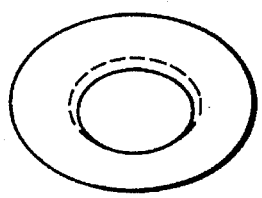 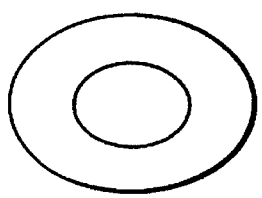 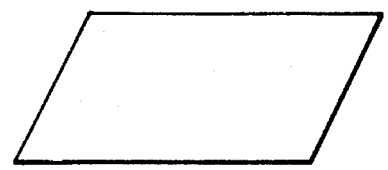
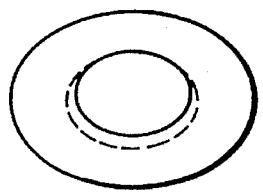 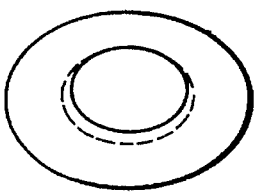 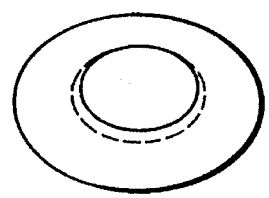
FIG. 7D       FIG. 7E       FIG. 7F
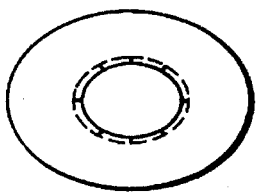 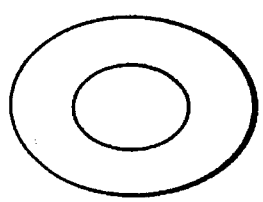 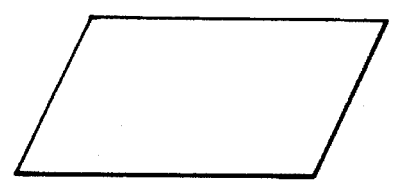
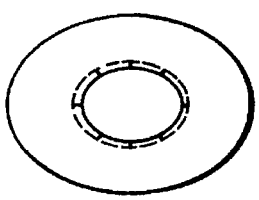 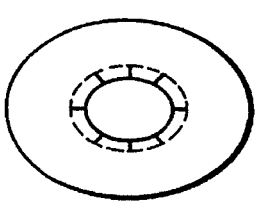 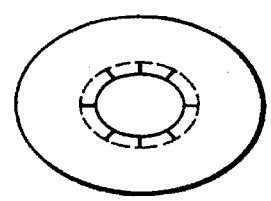

THIN DC-DC CONVERTER ARRANGEMENT

BACKGROUND OF THE INVENTION

1. Field of the Invention

The present invention relates to a thin DC-DC converter arrangement and more particularly, to a thin DC-DC converter arrangement which supplies stable DC power to a load of electronic equipment.

2. Description of the Related Art

As electronic device is made smaller in weight and size, its power supply has been made smaller in size and particularly in thickness. Most electronic devices are designed to operate not only on public power source but also on battery. In such an electronic device, a DC-DC converter is built in a power source port of the electronic device to convert unstable DC power into a desired stable DC voltage and then supply the DC voltage to a load. A DC voltage obtained by converting an AC voltage of a public power source by an AC adapter or a DC voltage supplied from a battery is generally not good in stability and accuracy.

Recently, DC-DC converters have been designed in an on-board type that is mounted on a circuit board of the main body. The on-board type DC-DC converter generally has a plurality of pins on its lower side which are connected by soldering to an electric circuit of the main body formed on a rear side of the circuit board of the main body through through-holes previously made in the main body circuit board.

As a conventional example of the on-board type DC-DC converter, there is known a converter having a structure such that a circuit board is fixedly mounted on one surface of a radiating fin and a supporting member having a drum type inductor (choke coil) fixed by caulking thereto is fixedly mounted on the other surface of the radiating fin (for example, refer to JP-U-2-82008, "Transistor Technology", 26 (1989) 6, p 497). This example, as in a general 3-terminal regulator, can be operated by adding electrolytic capacitors to its input and output.

This DC-DC converter is disadvantageous in making the converter smaller in size and low in leakage flux, because the converter uses a drum type inductor. That is, since the drum type inductor uses a drum type sintered ferrite core on which a coil is wound, the miniaturization has its limit. Further, because the converter uses the supporting member, it has been difficult to make the converter smaller in size and thickness. In addition, since the core of the drum type inductor for providing its magnetic circuit is not made in closed loop, much magnetic flux has leaked. The leakage flux causes misoperation of ICs or a circuit of an electronic device or generation of beat when inductors of DC-DC converter are mounted to be facing to each other, resulting in difficulty in making the electronic device smaller in size.

SUMMARY OF THE INVENTION

It is therefore an object of the present invention to provide a thin DC-DC converter arrangement which provides less leakage flux.

According to one aspect of the present invention, there is provided a thin DC-DC converter arrangement which comprises a radiator having a flat part; a thin circuit board fixed onto one surface of the flat part of the radiator and formed on its one surface with an electric circuit of a DC-DC converter; and a thin inductor fixed onto the other surface of the radiator, wherein the inductor includes a thin ring-shaped coil having a hole in its center and a thin ferrite core providing a closed magnetic path passing through the central hole of the coil and interlinking with the ring-shaped coil.

In an embodiment of the present invention, the ring-shaped coil is a printed coil made of electrically conductive material printed on a thin insulating plate in a form of a coil.

In another embodiment of the present invention, the ring-shaped coil is a fusion bonded coil obtained by fixing a fusible insulated wire wound into a form of coil.

According to another aspect of the present invention, there is provided a thin DC-DC converter arrangement which comprises an inductor including a thin ring-shaped coil having a hole in its center and a thin ferrite core providing a closed magnetic path passing through the central hole of the coil and interlinking with the ring-shaped coil; a thin circuit board formed on its one surface with an electric circuit of a DC-DC converter; a radiator having at least one flat part; and a fixing member for fixedly mounting the inductor on its one surface and the circuit board and the radiator successively in a stacked relationship on its other surface.

BRIEF DESCRIPTION OF THE DRAWINGS

FIGS. 7A to 7F are diagrams showing different sets of upper and lower insulating films for sandwiching a fusion bonded coil between them;

DESCRIPTION OF THE PREFERRED EMBODIMENTS

Figure 1A:
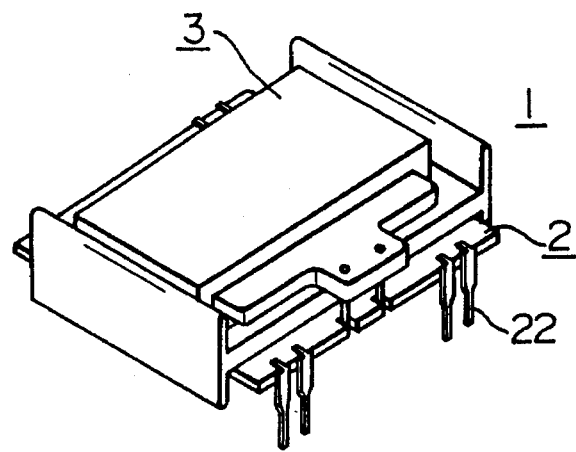
FIG. 1A is a perspective view showing an external configuration of a thin DC-DC converter arrangement in accordance with an embodiment of the present invention.
Figure 1B:
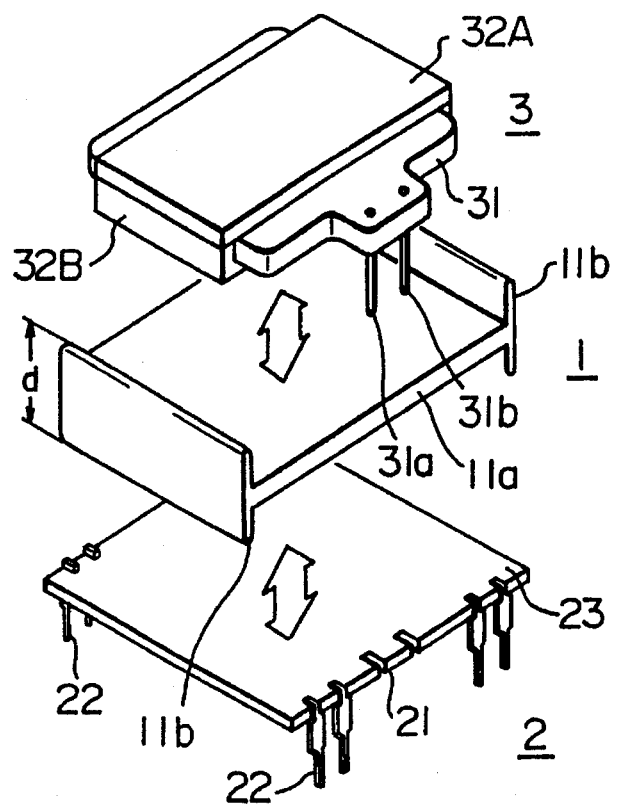
FIG. 1B is an exploded perspective view of main elements of the DC-DC converter of FIG. 1A.

A DC-DC converter in accordance with an embodiment of the present invention will be explained with reference to the accompanying drawings. In the present embodiment, as shown in FIGS. 1A and 1B, a heat radiator 1 has a circuit board 2 fixed onto its one surface and an inductor 3 fixed onto the other surface, the inductor 3 being made of a fusion bonded or printed coil 31 disposed between two members 32A and 32B of a closed magnetic circuit type ferrite core 32. Formed on a lower surface of the circuit board 2 are electronic parts of the DC-DC converter including FETs, diodes and ICs as well as resistors and electric wirings therefor.

The printed coil 31 is provided at its coil ends with pins 31a and 31b which in turn are electrically connected by soldering to terminals of the circuit board 2 provided on its lower side through holes 21 of the circuit board. The word "inductor" used herein refers to an inductor in which the fusion bonded or printed coil of the inductor functions not only as an impedance element but also as a transformer.

When the coil 31 is of a fusion bonded type, the fusible insulated conductor wire of the coil is plated at its ends with, e.g., soldering material, and the soldered ends of the coil are electrically connected by soldering to the terminals of the circuit board 2 provided on its lower side through the holes 21 of the circuit board.

The circuit board 2 is provided with a plurality of pins 22 which are passed through through-holes previously provided in a main body circuit board and electrically connected by soldering on its rear side, whereby the thin DC-DC converter is mounted on the main body circuit board. The pins 22, which are used as lead terminals for connection of input, output and grounding and also as pins for fixing of the circuit board, are formed at positions selected suitably in consideration of ease for fixing and electric connection of the circuit board 2 to the main body circuit board. Although the pins 22 are provided to extend downwardly of the circuit board 2 in FIG. 1, the pins 22 may be provided at one side of the circuit board 2 to extend laterally thereof. In this case, in order to electrically insulate the pins 22 from the radiator 1, a thermally conductive insulating sheet is inserted between the circuit board 2 and the radiator 1. When the pins 22 are provided at the side of the circuit board 2, it is easy to obtain a thin DC-DC converter of a low floor area type.

The radiator 1, which is made by molding a material excellent in heat radiation such as aluminum, has a planar part 11a and fins 11b provided at both ends of the planar part 11a. Both the surfaces of the planar part 11a are made flat to carry thereon the circuit board 2 and the inductor 3 having a printed coil 31 and a closed magnetic circuit type ferrite core 32. The two side plates 11b functioning as heat radiating fins are each designed to have an optimum width according to the thicknesses of the circuit board 2 and the inductor 3 and their heat generations.

For the purpose of reducing a width d of the side plates 11b and correspondingly making the inductor thin to thereby make the DC-DC converter thin, it is necessary to make the efficiency of the circuit higher to suppress heat generation.

A substrate 23 of the circuit board 2 may be a ceramic substrate, a resin wiring substrate, a flexible printed wiring substrate or a multi-layered substrate thereof.

The circuit board 2 may be fixedly mounted on one side of the radiator 1 by means of bonding, if necessary. In this connection, applicable adhesive agents include thermoelastic adhesive agents such as vinyl resins, acrylic resins, cellulose material or asphalt, thermoplastic resins such as epoxy resins, phenolic resins, melamine resins, polyamide resins, polyester resins, alkyd resins, urethane resins or silicone resins, elastomeric resins such as butadiene-acrylonitrile rubber or chlorinated rubber, and mineral adhesive agents such as silicate of soda.

Further, the circuit board 2 and the radiator 1 may be integrally formed. For example, by using a circuit board 2 made of an insulated metallic board, forming an electric circuit on its one surface covered by an insulating layer and forming the resultant board into a suitable shape, it is possible to have the circuit board 2 serving as a radiating fin. The insulated metallic board may be any metallic substrate on which insulating material is coated.

Figure 2A:
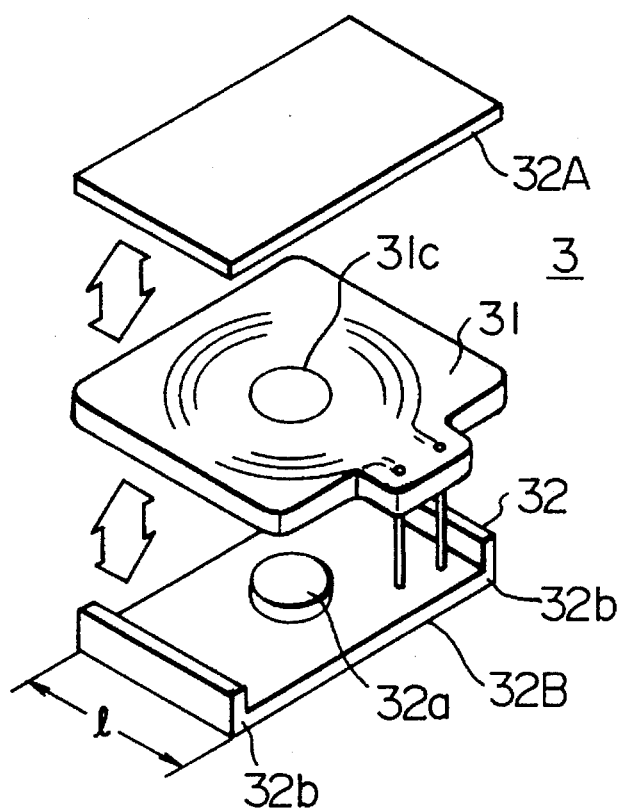
FIG. 2A is an exploded perspective view of an inductor using a printed coil.

As shown in FIG. 2A, the inductor 3 using a printed coil is made by sandwiching the printed coil 31 between the two core members 32A and 32B of the closed magnetic circuit type ferrite core 32. The printed coil 31 is in a form of, for example, a single-layered coil board made of a flexible printed wiring substrate having a copper film coated on its one or both surfaces, of which the copper film is subjected to photoetching to form a spiral planar coil or of a multi-layered coil board made of a plurality of single-layered coil boards stacked with insulating layers interposed therebetween. In the case of the multi-layered coil board, the respective spiral planar coils are electrically connected in series by Cu-plating through through-holes provided in the coil plates of the board so that a current flows through the respective spiral planar coils in the same direction. Further, the single-layered or multi-layered coil board is covered at its both surfaces with insulating layers.

The printed coil 31 has a circular ring outer shape conformed to the shape of the closed magnetic circuit type ferrite core 32. The printed coil 31 is formed in its center with a central hole 31c into which a central core 32a of the closed magnetic circuit type ferrite core 32 is inserted. Further, the single-layered or multi-layered coil board may be designed to have a circular or square shape or its intermediate shape. When a plurality of such single- or multi-layered coil boards are provided, there can be obtained an inductor having a transformer function.

Figure 3:
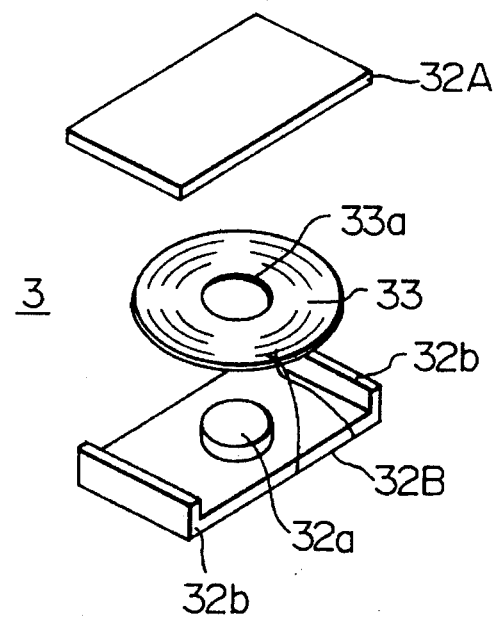
FIG. 3 is an exploded perspective view of an inductor in the form of a fusion bonded coil.

When the inductor 3 is the one using a fusion bonded coil, the inductor 3 is made, as shown in FIG. 3, of a fusion bonded coil 33 held between the two core members 32A and 32B of the closed magnetic circuit type ferrite core 32. The fusion bonded coil 33 is made by fixing a fusion insulated conductor wire wound in a coil.

In more detail, the fusion bonded insulated wire is a double-layer coated wire made by baking a fusion film of thermoplastic resin or thermoset resin on a wire coated with polyurethane or polyester. The wires can be bonded to each other by solvent, self-heating by current flow therethrough or hot air heating so that the fusion bonded coil can be made in an integral form with a considerably high bending strength.

The fusion bonded coil 33 is usually circular and provided at its center with a hole 33a into which the central core 32a of the closed magnetic circuit type ferrite core 32 is inserted. By using a plurality of fusion bonded coils, it is possible to make a transformer.

The conductor wire used for the fusion bonded insulated wire may be any of a round wire of a circular shape in section, a ribbon wire of a straight angular shape in section and a multi-core parallel conductor of a plurality of circular wires parallelly arranged. The conductor wire is wound on a coil frame from its inside (hole 33a). In this case, it is necessary to take out the starting end of the wire from the inside to the outer periphery of the coil, so that the thickness of the resultant coil becomes larger by a length corresponding to the diameter of the wire. Meanwhile, when the winding direction of the wire is changed in the inside at one point, both ends of the wound wire can be taken out from its outer periphery. Currents through respective turns of the coil flow in the same direction.

Figure 4A:
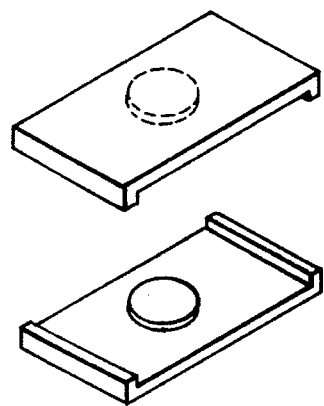
FIGS. 4A, 4B and 4C are exploded perspective views of different sorts of ferrite cores.
Figure 4B:
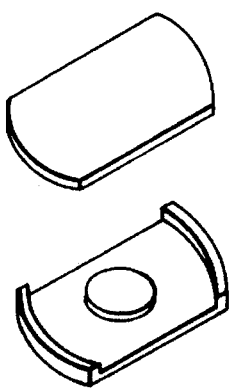
Figure 4C:
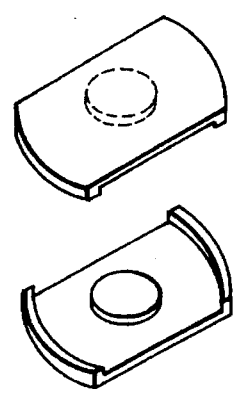

The closed magnetic circuit type ferrite core 32 is a flat core having a central core section 32a and two yoke sections 32b. The closed magnetic circuit type ferrite core 32 includes two core members 32A and 32B. There are many examples, as shown in FIGS. 4A to 4C of a combination of the two core members 32A and 32B other than a combination as shown in FIG. 2A or 3. More specifically, FIG. 2A or 3 shows a combination of the planar core member 32A and the ER type core member 32B; FIG. 4A shows a combination of two ER type core members; FIG. 4B shows a combination of a planar core member and a pot type core member; and FIG. 4C shows a combination of two pot type core members. In FIGS. 4A and 4C, each of the respective upper core members is provided on its lower surface with a central core which is projected downwardly. In FIGS. 2A, 3 and 4B, each of the respective upper core members has a planar lower surface. In either case, the upper and lower core members establish two closed magnetic paths which pass through the central core and interlink with the ring-shaped coil.

The inductor 3 is assembled by interposing the printed or fusion bonded coil 31 between the two core members 32A and 32B of the closed magnetic circuit type ferrite core 32. The two core members are fixed together by adhesive-backed tape, adhesive agent, mounting fitting, etc. On one surface of the radiating fin opposite to its surface on which the circuit board 2 is fixed, the inductor 3 is fixed by an adhesive agent like the circuit board 2. In order to improve a dielectric strength between the fusion bonded coil and the ferrite core, it is preferable to employ an insulating film or impregnate the coil with resin.

By the construction that the inductor is made of the printed or fusion bonded coil disposed between the two core members of the closed magnetic circuit type ferrite core, it is possible to make a thin inductor having a thickness of 6 mm or less and less leakage magnetic flux. By selecting the design of the circuit board and radiating fin suitably depending on the thickness of the inductor, a thin DC-DC converter which is high in efficiency and excellent in heat dissipation can be obtained. In this way, since a space volume occupied by a power supply part of an electronic device can be reduced and other parts and circuits can be arranged close to the inductor, the electronic device can be made smaller in size.

When a ribbon conductor wire or a multi-core parallel conductor is employed as the fusion bonded insulated wire, spaces defined between adjacent turns of the coil can be made smaller and thus the wire can be wound more closely as compared with a round wire. Therefore, when a fusion bonded coil of the same turns is made by using a wire having the same cross sectional area, the use of a ribbon wire or multi-core parallel conductor is advantageous because the fusion bonded coil can be made smaller in size, thickness and resistance as compared with other types of wires or conductors. In other words, the window area of the closed magnetic circuit type ferrite core can be made smaller so that the inductor or transformer can be made smaller in size and thickness and smaller in resistance thereby reducing heat generated by copper loss. Further, at high frequencies (above 500 kHz), the effective resistance can be smaller due to skin effect or proximity effect of current by using a ribbon wire or multi-core parallel conductor which has a larger surface area as compared with a wire or conductor of the other type having the same cross-section.

Next, explanation will be made as to measurement results of electromagnetic characteristics of thin DC-DC converters prepared in accordance with the present embodiment.

EXAMPLE 1

A thin DC-DC converter was prepared with use of an electric circuit of a chopper type regulator. The structure is substantially the same as that of FIGS. 1A and 1B. The radiator 1 was made by molding an alumina material, with the planar part 11a having a thickness of 3 mm and the fins 11b each having a width d of 15 mm. The circuit board 2 was made by forming on one surface of a substrate 23 of aluminum a circuit including electronic parts such as FETs, diodes or ICs, resistors and electric wirings for the thin DC-DC converter, and pins 22 serving as lead terminals for input, output and grounding connection and fixing pins of the substrate. The inductor 3 was made by sandwiching the printed coil 31 between the two core members 32A and 32B of the closed magnetic circuit type ferrite core 32.

The printed coil 31 was made by photoetching both sides of a flexible printing wiring board to form a single-layer coil board having a spiral planar coil of 3 turns on each side and stacking such single-layer coil boards in 6-layer with insulating films interposed therebetween. Interconnection between the spiral planar coils was made by electrically connecting the coils in series by Cu plating through holes provided in the respective boards so that an electric current flows through the respective coils in the same direction. The resultant stack was covered on its both surfaces with resist. Each spiral planar coil was formed in a circular disk shape and had a cross section of a width of 1000 µm and a thickness of 70 µm.

The printed coil 31 thus made had substantially an outer configuration as shown in FIG. 2A with a width of 17 mm, a length of 21 mm and a thickness of 1 mm. The central hole 31c had a diameter of 7.2 mm. The inductor 3 was made by sandwiching the printed coil 31 between a planar core member and an ER type core member, as shown in FIG. 4, of a closed magnetic circuit type ferrite core and fixing them with adhesive-backed tape. The closed magnetic circuit type ferrite core 32 was made of ferrite of a Mn-Zn series.

Figure 2B:
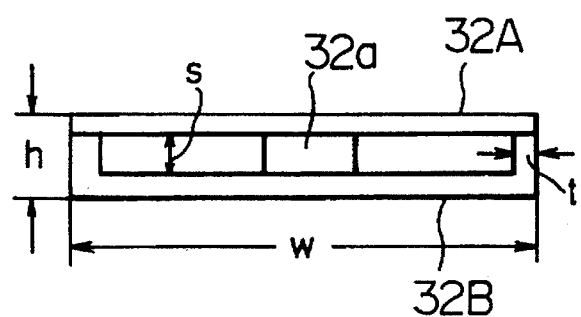
FIG. 2B is a side view of a ferrite core of the inductor of FIG. 2A.

The closed magnetic circuit type ferrite core 32 had the same outer configuration as shown in FIGS. 2A and 2B, and dimensions of a width w of 20 mm, a length l of 13 mm and a thickness h of 4 mm. An inner space (window) of the closed magnetic circuit type ferrite core 32 for mounting therein the printed coil 31 had a thickness s of 1 mm. The central core 32a had a diameter of 7.2 mm and each of the outer core parts 32b had a thickness t of 1.5 mm. A gap between the central core 32a and the core member 32A was 150 µm. A sinusoidal wave AC current having a frequency of 100 kHz and an amplitude of 1 mA was applied to the thus-obtained inductor 3 and the inductance of the inductor was measured. The measured inductance was 125 µH.

Further, by using a constant-current power source, 1000 mA of DC current superimposed on a sinusoidal wave AC current was applied to the inductor 3 and then its inductance and temperature-rise were measured. The measured inductance was 120 µH that was slightly smaller as compared with that in the absence of the superimposition of DC current. The temperature-rise was 12° C. (ambient temperature of 25° C.).

Figure 5:
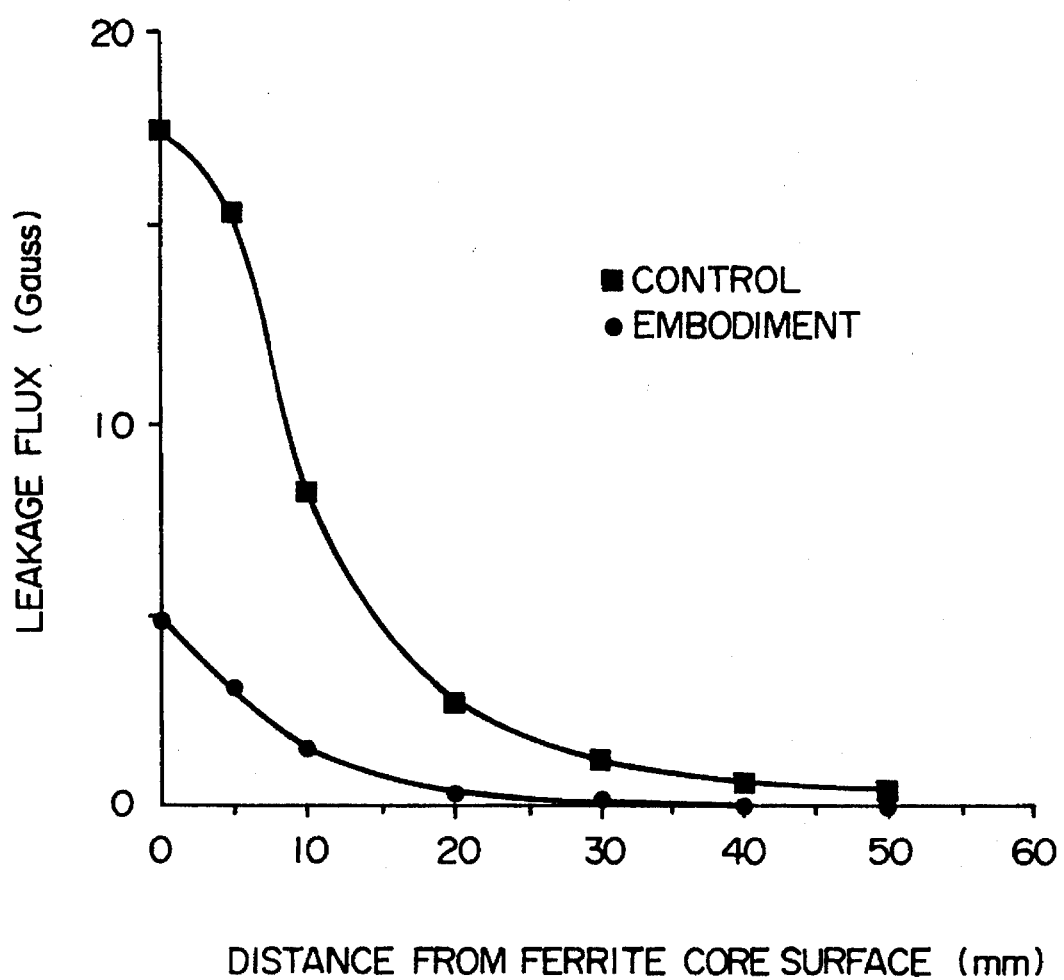
FIG. 5 shows a graph showing leakage fluxes of the thin DC-DC converter of the embodiment of the invention and a prior art DC-DC converter for comparison therebetween.

Next, a DC current of 1000 mA was supplied to the inductor and leakage magnetic flux existing above the central core 32a was measured in relationship with a distance from the surface of the core. Shown in FIG. 5 are measurement results of the inductor of this embodiment in comparison with measurement results of an inductor made according to the prior art as explained later. The leakage flux of the inductor 3 of the present embodiment was 1/3 or less of that of the inductor 6 of the prior art. It will be appreciated from this experiment that other parts and circuits can be arranged closer to the inductor.

The circuit board 2 and the inductor 3 were fixedly bonded onto the respective surfaces of the radiator 1 with the use of silicone adhesive.

The pins 31a and 31b provided at the ends of the printed coil 31 were electrically connected by soldering to circuit terminals provided on a lower surface of the circuit board 2 through the holes 21 of the circuit board 2.

A DC-DC converter thus obtained had a size of 22 mm×28 mm×15 mm (thick) excluding the pins 22.

EXAMPLE 2

A thin DC-DC converter was prepared substantially in the same manner as in the Example 1, except that the printed coil 31 was replaced by a fusion bonded coil. Six types of fusion bonded coils as shown in Table 1 were prepared by using fusible insulated wires of round wires, ribbon wires and multi-core parallel conductors, which were shaped by bonding and molding adjacent turns of the wire with the use of an organic solvent. The multi-core parallel conductor is made of 0.05 mm-diameter wires parallelly arranged. The number of turns of the conductor was 18 for all the coils like the Example 1. Each of the fusion bonded coils thus obtained was formed in a circular shape having a central hole of 7.6 mm in diameter, and outer diameter and thickness as shown in Table 1. When the starting end in winding of the wire was taken out from its inside along its outer periphery, the outer diameter of the lead wire was included in the thickness of the coil. With regard to each of the conductors Nos. 2, 4 and 6, both ends of the wire were taken out along the outer periphery by changing the winding direction at inside. In Table 1, Nos. 3 and 5 refer to single-layer coils, while Nos. 1, 2, 4 and 6 refer to 2-layer coils. The number of turns was expressed by (number of turns of each layer)×(number of layers). The outer diameter and thickness of the fusion bonded coil were made smaller than those of the printed coil in the Example 1. Thus, it is possible to make the flat ferrite core correspondingly smaller in size and thickness or the cross-sectional area of the conductor larger, thereby reducing its resistance by using the fusion bonded coil of the Example 2.

TABLE 1

| No. | Conductor Type (Sectional Configuration) | Turns of Wire | Outer Diameter/ thickness |
|---|---|---|---|
| 1 | Round (diameter 0.26 mm) | 9 × 2 | 13.0 mm/1.0 mm |
| 2 | Round (diameter 0.3 mm) | 9 × 2 | 14.0 mm/0.7 mm |
| 3 | Ribbon (0.75 × 0.095 mm$^2$) | 18 × 1 | 12.5 mm/0.9 mm |
| 4 | Ribbon (0.40 × 0.180 mm$^2$) | 9 × 2 | 11.5 mm/0.9 mm |
| 5 | Multi-core parallel (0.75 × 0.10 mm$^2$) | 18 × 1 | 12.5 mm/0.9 mm |
| 6 | Multi-core parallel (0.40 × 0.20 mm$^2$) | 9 × 2 | 12.0 mm/0.9 mm |

Each inductor was made by sandwiching the fusion bonded coil between the upper and lower members of the same closed magnetic circuit type ferrite core as that in the Example 1. A sinusoidal wave AC current having a frequency of 100 kHz and an amplitude of 1 mA was applied to the inductor and the inductance of the inductor was measured. The measured inductances of the respective inductors were between 125 and 130 µH.

Further, 1000 mA of DC current superimposed on the above sinusoidal wave AC current was applied to the inductor 3 and then the inductance and temperature rise were measured. The measured inductances of the respective inductors were between 120 and 125 µH that were slightly smaller as compared with that in the absence of the superimposition of the DC current. The temperature rise at an ambient temperature of 25° C. was 13° C. in the case of the fusion bonded coil No. 1 and was between 11° and 12° C. in each of the coils Nos. 2 to 6. Next, when a DC current of 1000 mA was supplied to the inductor, the leakage magnetic flux at an area above the central cores 32a was substantially the same as that in the Example 1.

The sizes of the obtained thin DC-DC converters were substantially the same as those of the Example 1.

The thin DC-DC converter for control purposes was prepared with use of an electric circuit of a chopper type regulator. The inductor was a drum type inductor made of a drum type Ni-Zn ferrite core and an insulator-covered wire of 500-µm-diameter wound by 43 turns thereon. The inductor had a size of 18 mm (diameter)×14 mm (height) and the diameter of the center hole was 4.5 mm. The inductance, DC superimposition characteristic and the heat generation characteristic of the drum type inductor were substantially the same as those of the inductor of the Example 1 made of the printed coil interposed between the upper and lower members of the closed magnetic circuit type ferrite core. Next, a DC current of 100 mA was supplied to the inductor and, then the leakage flux generated at an area above the hole of the inductor was measured in relationship with a distance from the core surface. The measurement results are shown in FIG. 5.

The radiator and the circuit board were the same as those of the Example 1, except that the width d of each fin was 26 mm.

The circuit board was fixedly bonded on one surface of the radiator by adhesive and a supporting member to which the drum type inductor was fixed by caulking was fixedly mounted on the other surface of the radiator. The ends of the winding wire were connected by soldering to circuit terminals provided to the circuit board. The size of the obtained DC-DC converter was 26 mm×28 mm×26 mm excluding the pins.

In accordance with the present embodiment, since the thin DC-DC converter is arranged so that the circuit board is fixedly mounted onto one surface of the radiator and the inductor or transformer having the printed or fusion bonded coil sandwiched between the upper and lower members of the closed magnetic circuit type ferrite core is fixedly mounted onto the other surface of the radiator, the DC-DC converter can be made small in thickness and low in leakage flux. As a result, a space occupied by the power supply in an electronic device can be reduced and other parts and circuits can be disposed close to the inductor or transformer, whereby the electronic device can be made smaller in size.

Further, when a ribbon wire or multi-core parallel conductor is employed as the fusible insulated wire, the spaces defined between the adjacent turns of the conductor can be made smaller and thus the conductor can be arranged more closely was compared with a round wire. Therefore, the fusion bonded coil can be made smaller in size, thickness and in resistance. That is, since the window area of the closed magnetic circuit type ferrite core can be made smaller, the inductor or transformer can be made smaller in size and thickness, and the heat generation caused by the copper loss can be reduced by the lower resistance.

An explanation will next be made of a second embodiment of the present invention. The second embodiment is different from the first embodiment in that the insulation between the coil and the core of the inductor in the first embodiment is improved, and other parts are substantially the same as the first embodiment.

More specifically, in order to protect a user from an electric shock and to cause normal operation of the device, it is necessary to ensure sufficient insulation between the coil and the core of the inductor. When it is desired to use the inductor as a choke coil for example, the inductor is required to have a dielectric strength of usually 500V or more.

Meanwhile, when an inductor is manufactured by disposing the fusion bonded coil directly between the two members of the closed magnetic circuit type ferrite core, the resultant inductor may sometimes have an unsatisfactory dielectric strength, thereby reducing its yield. This problem becomes remarkable, in particular, when a ribbon wire is employed for the coil. In this case, insulation failure is observed inside the fusion bonded coil (in the side of the central hole), in the upper and lower sides and even in its area where the wire is taken out.

It is considered that the insulation failure is derived from peel-off of an insulating film coated on the coil wire during preparation of the fusion bonded coil or inductor. In the case of the ribbon wire, in particular, the insulating film of the wire becomes thin at its angular corners and thus pin holes or the like tend to easily occur, so that the problem as mentioned above becomes remarkable.

To avoid this problem, in a thin DC-DC converter of the second embodiment of the invention, an inductor as thin as 5 mm or less is made by sandwiching a fusion bonded coil between the two members of the closed magnetic circuit type ferrite core with an insulating film disposed therebetween.

Figure 6A:
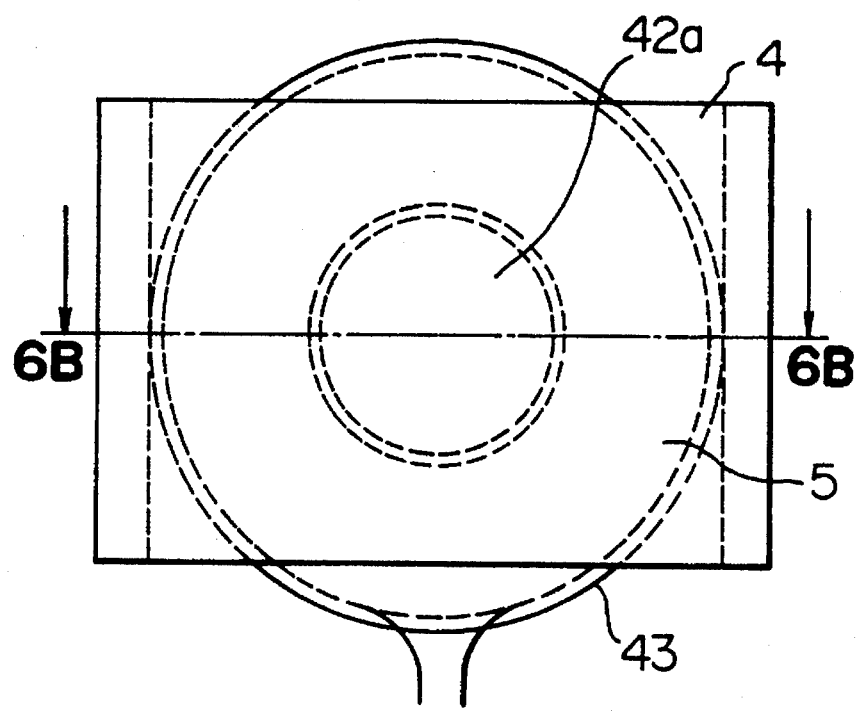
FIG. 6A is a plan view of an inductor in another embodiment of the present invention.
Figure 6B:
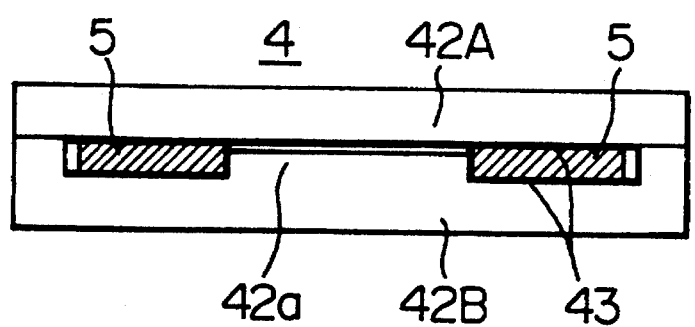
FIG. 6B is a cross-sectional view taken along line A—A in FIG. 6A.

FIGS. 6A and 6B show an example of structure of the thin inductor in the second embodiment. In more detail, FIG. 6A is a plan view of the inductor and FIG. 6B is a cross-sectional view of the inductor taken along line A—A in FIG. 6A. As compared with the first embodiment of FIG. 3 it will be seen that an insulating film 43 is disposed between a fusion bonded coil 5 and each of two members 42A and 42B of a closed magnetic circuit type ferrite core 4. The insulating film 43 may be of a two-sheet type which sandwiches the fusion bonded coil 5 from its upper and lower sides by separate sheets or of a single-sheet type which is folded to wrap the fusion bonded coil on its upper and lower sides.

FIGS. 7A to 7F show perspective views of examples of the two-sheet type of films. In FIGS. 7A, 7B and 7C, one or each of the upper and lower insulating films is formed with a recess for reception of a central core 42a of the core member 42B. The recess functions to insulate the fusion bonded coil from the central core. The recesses, when formed to both the upper and lower insulating film, may be abutted to each other or overlapped by making the diameters of the recesses different from each other. In FIG. 7B, one of the insulating films is formed with a hole. In FIG. 7C, one of the films is provided with no hole and disposed between the planar core and an ER type or pot type core to serve as a gap spacer disposed between the central core 42a and the core member 42A.

In FIGS. 7D, 7E and 7F, one or each of the upper and lower insulating films is formed with a hole for passage of the central core and a plurality of radial slits at a periphery of the hole. Thus, when the central core is inserted into the hole, film pieces separated by the above slits are bent toward the fusion bonded coil to isolate the central core from the fusion bonded coil. The bent film pieces may be abutted or overlapped each other. The number of the slits may be selected suitably according to the diameter of the hole. In FIG. 7E, as in FIG. 7B, only one of the upper and lower films is formed with a hole and slits at a periphery of the hole. In FIG. 7F, as in FIG. 7C, one of the upper and lower films has no hole and is disposed between the planar core member and the ER or pot type core member to serve as a gap spacer between the central core 42a and the core member 42A.

Figure 8:
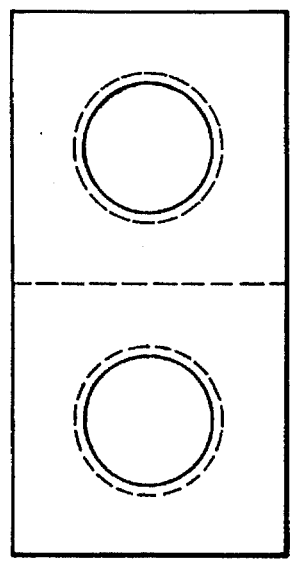
FIG. 8 is a diagram showing an example of an insulating film which is folded with a fusion bonded coil disposed therein.

FIG. 8 is a plan view of an example of the aforementioned single-sheet type corresponding to a sheet obtained by integrally connecting the upper and lower films of FIG. 7A together. Similarly, when the two upper and lower insulating films in each of FIGS. 7B to 7F are joined together, the single-sheet type can be obtained which is folded to cover the fusion bonded coil from its upper and lower sides.

The insulating film is made larger in size than the fusion bonded coil and in a suitable shape depending on the configuration of the ferrite core. The insulating film may be prepared by cutting a planar film or by injection molding or mold-casting. Formation of a recess hole in the planar film can be realized, e.g., by hot pressing the film before or after formation of a hole.

The insulating film may be made mainly of thermoelastic resin such as polyester, nylon, cellulose, acetate, vinyl chloride, vinylidene chloride, polyvinyl acetal, polyethylene, polypropylene, fluorine plastic, polycarbonate or polyether, thermoset resin such as epoxy, phenolic resin, unsaturated polyester, alkyd, melamine, silicone, polyurethane, or an insulating paper sheet. The thickness of the insulating film may be suitably selected according to the window area or the degree of insulation for the closed magnetic circuit type ferrite core, and preferably 10 μm–500 μm from the viewpoint of ease in the film preparation and handling.

In a thin inductor that is made by sandwiching the fusion bonded coil, which is formed by fixing a coil of a fusible insulated wire, between the two members of a closed magnetic circuit type ferrite core, the insulation failure as mentioned above can be avoided by the aforementioned insulating film interposed between the coil and the core. In other words, the breakdown voltage between the flat closed magnetic circuit type ferrite core and the fusion bonded coil disposed at its narrow window can be made higher, thereby improving the product yield.

The insulation characteristic between the fusion bonded coil and ferrite core of the thin inductor prepared according to the second embodiment is as follows:

EXAMPLE 1

A fusion bonded coil was prepared by winding a ribbon wire of 0.75×0.095 mm in section as the fusible insulated wire by 26 turns and then bonding and molding the adjacent turns of the coil with use of organic solvent. The fusion bonded coil had a circular outer contour, an outer diameter of 15 mm and a thickness of 0.9 mm, and a central hole thereof had a diameter of 7.6 mm. It was necessary to take out a winding starting end of the wire from its inside along its outer periphery and thus the diameter of the wire was included in the thickness of the coil.

The closed magnetic circuit type ferrite core was the same as that used in the Example 1 of the first embodiment.

The insulating films as used include six different two-sheet types each having upper and lower insulating film pieces as shown in FIGS. 7A to 7F and six different single-sheet types obtained by integrally joining the upper and lower insulating film pieces of each of the above two-sheet types to be later folded. One hundred of such insulating films were prepared for each of the two- and single-types. The two core members were fixed by adhesive-backed tape. The films were all made of polyester having a thickness of 50 μm.

100 Test samples were prepared for each of different sorts of thin inductors using respectively 12 varieties of the insulating film and the insulation was tested by applying DC 500 volts across the coil and the core of each sample by a breakdown voltage tester.

As a result, it has been found that all the samples satisfy the breakdown voltage test.

Thin inductors used as control were the same as the inductors used in the Example 1, except that the insulating film was omitted. 100 Control devices of the thin inductors were subjected to the breakdown voltage tests in the same manner as in the Example 1. As a result of measurement results, it has been found that 25 of the 100 controls are unsatisfactory with respect to the breakdown voltage.

In accordance with the present embodiment, it is possible to prevent insulation failure of the thin inductor having the fusion bonded coil interposed between the two members of the closed magnetic circuit type ferrite core, by interposing the insulating film between the coil and the core. That is, since the breakdown voltage between the flat ferrite core of the closed magnetic circuit type and the fusion bonded coil provided in its narrow window can be kept at its satisfactory level, product yield can be improved.

This effect becomes remarkable especially when the fusion bonded coil is made by fixing a coil of a fusible insulated ribbon wire.

Explanation will then be made of a third embodiment of the present invention. Although the thin inductor and the circuit board are fixed onto the both surfaces of the radiator, respectively, in the first embodiment, a fixing member for holding the thin inductor, the circuit board and the radiator is specifically provided in the third embodiment. The third embodiment will be explained by referring to FIGS. 9, 10, 11A to 11C and 12A to 12C.

Figure 9:
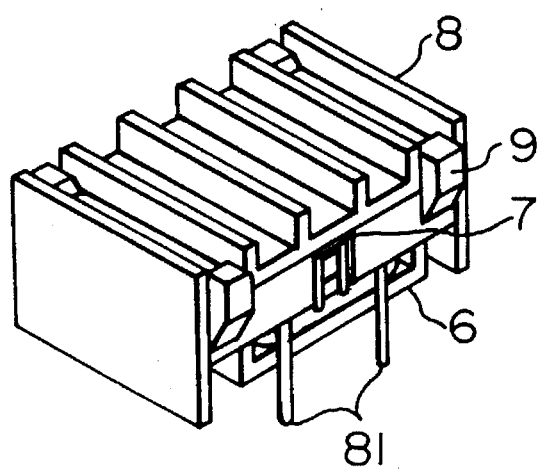
FIG. 9 is a perspective view showing an external configuration of a thin DC-DC converter arrangement in accordance with another embodiment of the present invention.
Figure 10:
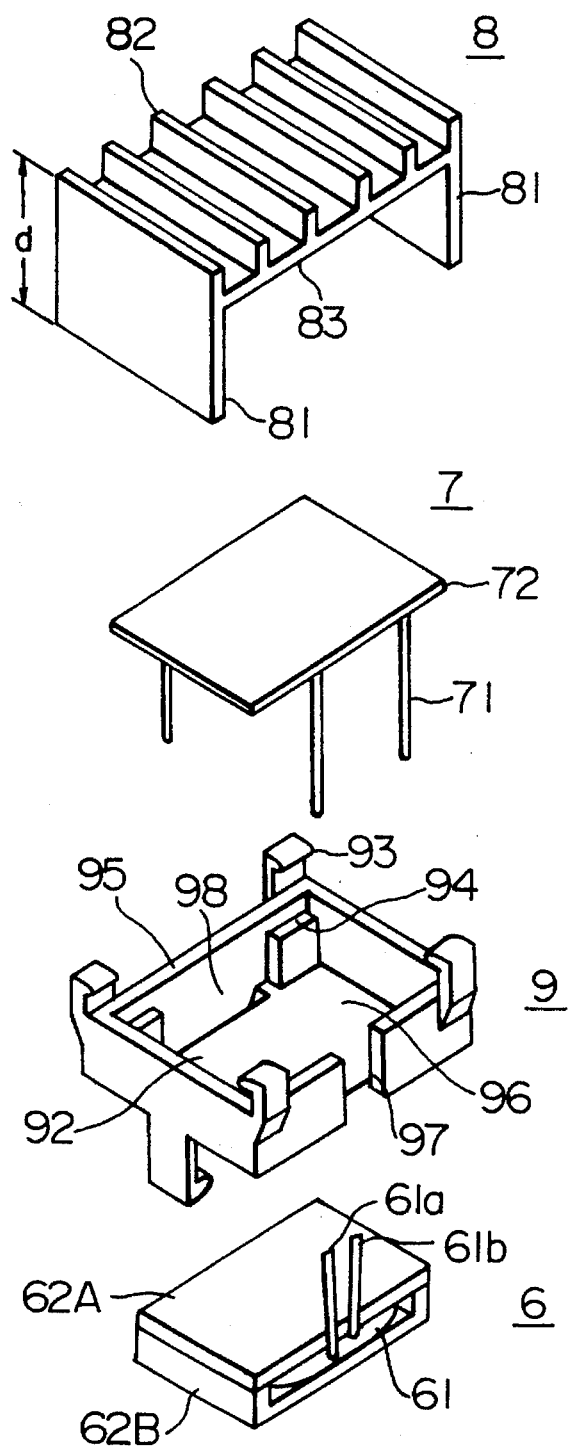
FIG. 10 is an exploded perspective view of main elements of the DC-DC converter of FIG. 9.

As shown in FIGS. 9 and 10, a thin DC-DC converter in accordance with the third embodiment includes an inductor 6, a circuit board 7, a radiator 8 and a fixing member 9. The inductor 6 is held on one surface of the fixing member 9, while the circuit board 7 and the radiator 8 are held on the other surface of the fixing member 9. The thin inductor 6 and the circuit board 7 are basically the same as those in the first embodiment, except that the inductor and circuit board are slightly different in size from those in the first embodiment. When the thin inductor 6 uses a fusion bonded coil, it is desirable to interpose an insulating film between the fusion bonded coil and the ferrite core for insulation therebetween, as in the second embodiment.

The radiator 8, which is made of a metallic material excellent in heat dissipation such as aluminum, has a fin plate 83 provided on its one surface with a multiplicity of radiating fins 82 and side plates 81 fixed to both ends of the fin plate 83 to function as radiating fins. The other surface of the fin plate 83 is flat adapted to be in close contact with a surface of the circuit board 7 having no circuit. The circuit board 7 is fixed to the radiator 8 desirably by insulating adhesive having an excellent heat conductivity such as silicone resin for good heat dissipation. However, if necessary, in place of the adhesive material, only an insulating film having a good heat conductivity may be inserted between the circuit board and the radiator. A width d of the side plate 81 is optimumly determined by the thicknesses and heat generation of the circuit board 7 and inductor 6.

In order to make thin the overall thickness of the DC-DC converter, it is necessary not only to employ a thin inductor but also to make small the width d of the side plates 81 of the radiator 8. To this end, it is obvious that the efficiency of the circuit is required to be high to provide less heat generation.

The plate 72 of the circuit board 7 is made of a ceramic substrate, a resin wiring substrate, a flexible printed wiring circuit substrate or a multi-layer board of a plurality of the substrates as stacked.

The circuit board 7 may be integrally formed with the radiator 8. For example, by using an insulated metallic plate, the circuit arrangement is formed on its one surface coated with an insulating layer and the plate suitably shaped so that the plate functions as the radiator 3. The word "insulated metallic plate" used herein refers to a metallic plate, of which one surface is coated with any insulating material.

The circuit board 7 and the radiator 8 are fixedly held on one surface of the fixing member 9 opposite to the surface on which the inductor 6 is held.

The fixing member 9 is provided with pawls 91 for fixedly holding the inductor 6, a holding part 92, pawls 93 for fixedly holding the circuit board 7 and the radiator 8, supporters 94 and 95 for supporting the circuit board 7 and the radiator 8, a recess 96 for containing the circuit arrangement provided on the lower surface of the circuit board 7, a slot 97 for passage of coil ends, and slots 98 for passage of pins 71.

The inductor as well as the circuit board and the radiator can be easily fixed by inserting them between the pawls and the supporters. In order to realize good fixing of the inductor, the holding part 92 for fixedly holding the inductor 6 is provided on its one surface formed with the pawls 91 with a recess or projection which has a width slightly larger than a distance between both sides of the flat ferrite core 62 which are not engaged with the pawls 91. Further, for the purpose of enhancing heat dissipation, the holding part 92 may be provided with a hole having size and shape so as not to interfere with the holding of the inductor.

Figure 11C:
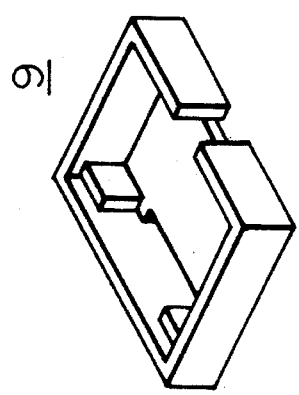
FIGS. 11A, 11B and 11C are perspective views of different examples of a holding member in the DC-DC converter.
Figure 11B:
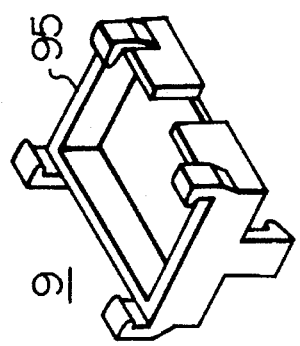
Figure 11A:
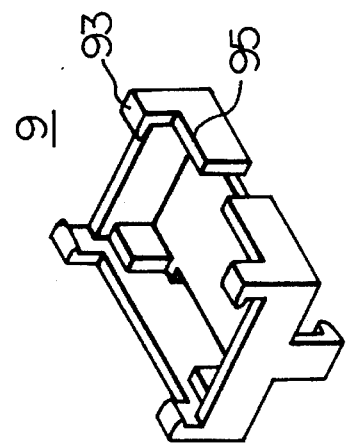
Figure 12C:
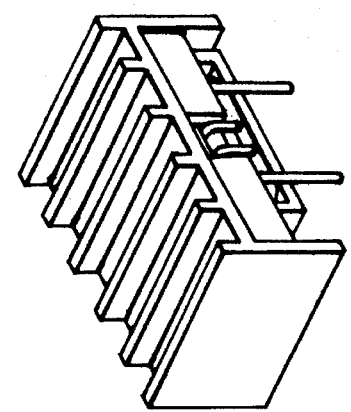
FIGS. 12A, 12B and 12C are perspective views of DC-DC converters assembled with use of the holding members of FIGS. 11A, 11B and 11C respectively.
Figure 12B:
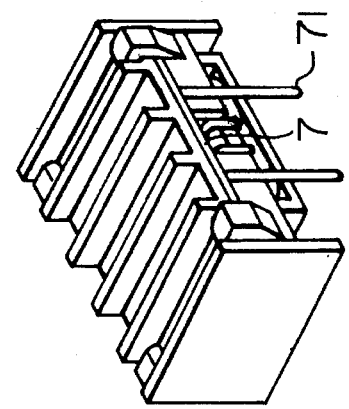
Figure 12A:
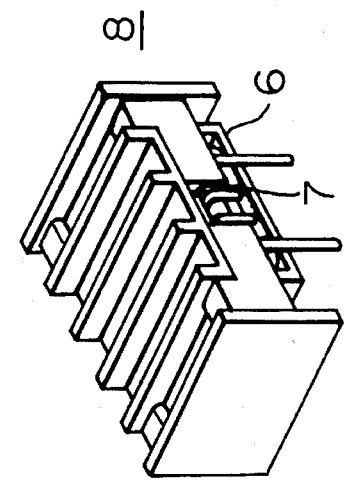

FIGS. 11A to 11C show various modifications of the fixing member 9 and FIGS. 12A to 12C show examples of the construction of the thin DC-DC converter using those modifications.

In FIGS. 11A and 12A, the pawls 93 for fixedly holding the circuit board 7 and the radiator 8 are provided at ends of the supporters 95 for supporting the radiator 8, while the radiator 8 is provided in its parts with notches for engaging the pawls 93.

In FIG. 11B and 12B, the supporters 95 for supporting the radiator also serve as supporters for supporting the circuit board 7, and the circuit board 7 is fixedly mounted on the supporters 95. Further, the pins 71 of the circuit board 7 are positioned outside the fixing member 9 and hence the fixing member 9 is provided with no slot for passage of the pins 71.

In FIGS. 11C and 12C, the pawls for fixedly holding the inductor 6, the circuit board 7 and the radiator 8 are not provided and these components are fixed directly by means of silicone adhesive or the like.

The material used for making the fixing member 9 includes thermoplastic resin such as polypropylene, polyester or vinyl chloride, thermoset resin such as epoxy, phenol or alkyd. The fixing member made of such resin material can be made by injection molding, mold casting or by cutting it from a plate material.

When the fixing member 9 has a structure as shown in FIG. 11C, the fixing member 9 may be made of ceramic material such as alumina, zirconia or spinel having an excellent heat conductivity for good heat dissipation. In this case, the fixing member made of ceramic material can be made by sintering after formation or by cutting-out from a plate material.

Next, explanation will be made of measurement results of the electromagnetic characteristic of the DC-DC converter prepared in accordance with the third embodiment.

EXAMPLE 3

Each of thin DC-DC converters was prepared respectively by using an electric circuit of a chopper type regulator. The converter structure included four varieties as shown in FIGS. 1A, 12A, 12B and 12C. The circuit board 7 was the same as that used in the Example 2 of the first embodiment. The radiator 8 was made of aluminum and the width d of the side plate was 12.5 mm.

The inductors 6 were made each by using a fusion bonded coil in 6 different types Nos. 1 to 6 the same as those used in the Example 2 of the first embodiment as shown in Table 1. The width w, length l and thickness h of the outer contour of the ferrite core were 17 mm, 13 mm and 4 mm, respectively, and the thickness s of the window of the ferrite core for reception of the fusion bonded coil was 1 mm. Further, the diameter of the central core (refer to FIGS. 2A and 2B) provided to the lower core member 32B was 7.2 mm, the gap between the central core and the upper core member 32A was 150 μm, and the thickness of the lower core member 32B was 1.5 mm.

The adhesive agent used for fixing the inductor 6, circuit board 7 and radiator 8 to the fixing member 9 was silicone adhesive. The size of the DC-DC converter excluding the pins 71 was 22 mm×26 mm×12.5 mm (thick).

The inductances of the inductors were measured while supplying a sinusoidal wave AC current of a frequency of 100 kHz and an amplitude of 1 mA to each of the inductors. The measured inductances were in a range of 128 to 133 μH. At an ambient temperature of 25° C. the temperature rise was 14° C. in the case of the fusion bonded coil No. 1 and between 12° and 13° C. in the case of the fusion bonded coils Nos. 2 to 6.

Next, the leakage fluxes were measured in the same manner as Example 1 of the first embodiment, while supplying a DC current of 1000 mA to each of the inductors. The measured leakage fluxes were compared with those measured in the same control as that used in Example 1 of the first embodiment. The results of comparison were substantially the same as those obtained in Example 1 of the first embodiment shown in FIG. 4.

EXAMPLE 4

Thin DC-DC converters were prepared in substantially the same manner as in the Example 3 except that the inductors were made by using the printed coils in place of the fusion bonded coils, and hence the same as the inductors used in Example 1 of the first embodiment.

The inductor 6, the circuit board 7 and the radiator 8 were fixed to the respective surfaces of the fixing member 9 by pawls or silicone adhesive material. Pins were provided at ends of the printed coil and connected by soldering to circuit terminals provided on a lower surface of a circuit board through the slot 97 of the fixing member 9. Each of the thus-prepared DC-DC converters had a size of 22 mm×28 mm×125 mm (thick).

The inductances of the inductors of the DC-DC converters were measured, while supplying a sinusoidal wave AC current having a frequency of 100 kHz and an amplitude of 1 mA to each inductor. The measured inductance was 125 μH.

Further, a DC current of 1000 mA was superimposed on the above AC current and then supplied to the inductors to measure their inductances and temperature rises. The measured inductance was 120 μH that was slightly smaller than that in the absence of the superimposition of the DC current; while the measured temperature rise was 12° C. (at the ambient temperature of 25° C.) that was the same as that as measured in the Example 1 of the first embodiment. Next, a DC current of 1000 m/A was supplied to the inductor and the leakage magnetic flux existing above the central core 32A was measured in relationship with a distance from the surface of the core. The measured results were the same as those of the Example 3 which were substantially unchanged from those in the Example 1 of the first embodiment.

The third embodiment is substantially the same as the first embodiment in the electromagnetic characteristic and has substantially the same effect in making the device small in size and thickness. Meanwhile, the third embodiment is slightly higher in cost as compared with the first embodiment since the third embodiment requires the additional fixing member. However, the third embodiment provides a larger freedom in design of the radiator and an improved heat dissipation effect. Accordingly, the third embodiment is suitable when a high heat dissipation characteristic is required.

What is claimed is:

1. A thin DC-DC converter arrangement comprising:

an inductor including a thin ring-shaped coil having a hole in its center and a thin ferrite core for providing a closed magnetic path passing through the central hole of said coil and interlinking the ring-shaped coil, reducing magnetic leakage flux which emanates from said ring-shaped coil;

a thin circuit board formed on its one surface with an electric circuit of said DC-DC converter; and a radiator having at least one flat part, wherein said inductor, said circuit board and said radiator are integrally assembled.

2. A thin DC-DC converter arrangement comprising:

a radiator having a flat part;

a thin circuit board fixed onto one surface of the flat part of said radiator and formed on its one surface with an electric circuit of said DC-DC converter; and a thin inductor fixed onto the other surface of the flat part of said radiator, wherein said inductor includes a thin ring-shaped coil having a hole in its center and a thin ferrite core for providing a closed magnetic path passing through the central hole of said coil and interlinking the ring-shaped coil which reduces magnetic leakage flux.

3. A thin DC-DC converter arrangement according to claim 2, wherein said ring-shaped coil is a printed coil made of electrically conductive material printed on a thin insulating plate in a form of a coil.

4. A thin DC-DC converter arrangement according to claim 2, wherein said ring-shaped coil is a fusion bonded coil made by fixing a coil-shaped winding of a fusible insulated wire.

5. A thin DC-DC converter arrangement according to claim 4, wherein said fusible insulated wire is a ribbon wire.

6. A thin DC-DC converter arrangement according to claim 4, wherein said fusible insulated wire is a multi-core parallel conductor.

7. A thin DC-DC converter arrangement according to claim 2, further comprising insulating means for insulating said ring-shaped coil from said ferrite core.

8. A thin DC-DC converter arrangement according to claim 7, wherein said insulating means includes at least one insulating film inserted between said ring-shaped coil and said ferrite core.

9. A thin converter arrangement comprising:

an inductor including a thin ring-shaped coil having a hole in its center and a thin ferrite core for providing a closed magnetic path passing through the central hole of said coil and interlinking the ring-shaped coil reducing leakage flux from said coil;

a thin circuit board formed on its one surface with an electric circuit of said DC-DC converter;

a radiator having at least one flat part; and a fixing member for fixedly mounting said inductor on its one surface and said circuit board and said radiator in a stacked relationship on its other surface.

10. A thin DC-DC converter arrangement according to claim 9, wherein said circuit board is bonded to said flat part of said radiator by an adhesive agent.

11. A thin DC-DC converter arrangement according to claim 9, wherein said circuit board is bonded to said flat part of said radiator by an adhesive agent to form a single unit, and said fixing member is provided with at least one pawl for fixedly holding said unit on the other surface thereof.

12. A thin DC-DC converter arrangement according to claim 9, wherein said fixing member has at least one pawl for fixedly holding said inductor on its one surface.

13. A thin inductor comprising:

a thin ring-shaped fusion bonded coil made of a fusible insulated wire and formed in its center with a hole;

a thin ferrite core including upper and lower core parts, combined with said fusion bonded coil such that said fusion bonded coil is disposed between said upper and lower core parts thereby providing a closed magnetic path passing through the hole of said fusion bonded coil and interlinking said ring-shaped coil; and an insulating film inserted between each of said upper and lower core parts and said fusion bonded coil.

14. A thin inductor according to claim 13, wherein said insulating film includes a first film piece inserted between one of said upper and lower core parts and said fusion bonded coil, and a second film piece inserted between the other of said upper and lower core parts and said fusion bonded coil.

15. A thin inductor according to claim 14, wherein said first and second film pieces are formed in a single continuous sheet.

16. A thin inductor according to claim 14, wherein said first and second film pieces are formed in separated individual sheets.

* * * * *

CERTIFICATE OF CORRECTION

PATENT NO. : 5,621,636
DATED : April 15, 1997
INVENTOR(S): Tanigawa et al.

It is certified that error appears in the above-identified patent and that said Letters Patent is hereby corrected as shown below:

TITLE PAGE: ITEM
[73] Assignee: Please add --and Yutaka Electric Mfg. Co., Ltd.--

Signed and Sealed this

Seventeenth Day of March, 1998

Attest:

BRUCE LEHMAN

Attesting Officer

Commissioner of Patents and Trademarks